(12) United States Patent
Teng

(10) Patent No.: US 7,645,567 B2
(45) Date of Patent: Jan. 12, 2010

(54) ON-PRESS DEVELOPMENT OF HIGH SPEED LASER SENSITIVE LITHOGRAPHIC PRINTING PLATES

(76) Inventor: Gary Ganghui Teng, 10 Kendall Dr., Northborough, MA (US) 01532

( * ) Notice: Subject to any disclaimer, the term of this patent is extended or adjusted under 35 U.S.C. 154(b) by 0 days.

(21) Appl. No.: 12/106,278

(22) Filed: Apr. 19, 2008

(65) Prior Publication Data

US 2008/0213700 A1 Sep. 4, 2008

Related U.S. Application Data

(63) Continuation of application No. 11/057,663, filed on Feb. 14, 2005, now Pat. No. 7,427,465.

(51) Int. Cl.
*G03F 7/26* (2006.01)
*G03C 1/00* (2006.01)

(52) U.S. Cl. .................... 430/302; 430/270.1

(58) Field of Classification Search .............. 430/270.1, 430/302
See application file for complete search history.

(56) References Cited

U.S. PATENT DOCUMENTS

| | | | | |
|---|---|---|---|---|
| 4,977,076 A | * | 12/1990 | Okazaki et al. | 430/583 |
| 5,258,263 A | | 11/1993 | Cheema et al. | 101/456 |
| 5,422,204 A | | 6/1995 | Yoshinaga et al. | 430/2 |
| 5,599,650 A | | 2/1997 | Bi et al. | 430/273.1 |
| 5,607,816 A | | 3/1997 | Fitzgerald et al. | 430/271.1 |
| 5,616,449 A | | 4/1997 | Cheng et al. | 430/302 |
| 5,677,108 A | | 10/1997 | Chia et al. | 430/273.1 |
| 5,910,395 A | | 6/1999 | Li et al. | 430/302 |
| 6,014,929 A | | 1/2000 | Teng | 101/456 |
| 6,136,503 A | | 10/2000 | Zheng et al. | 430/270.1 |
| 6,153,356 A | | 11/2000 | Urano et al. | 430/281.1 |
| 6,232,038 B1 | | 5/2001 | Takasaki et al. | 430/281.1 |
| 6,309,792 B1 | | 10/2001 | Hauck et al. | 430/270.1 |
| 6,331,375 B1 | | 12/2001 | Kawamura et al. | 430/270.1 |
| 6,482,571 B1 | | 11/2002 | Teng | 430/302 |
| 6,576,401 B2 | | 6/2003 | Teng | 430/303 |
| 6,689,537 B2 | | 2/2004 | Urano et al. | 430/273.1 |
| 6,740,464 B2 | | 5/2004 | Maemoto | 430/138 |
| 2002/0199149 A1 | * | 12/2002 | Nagasaki et al. | 714/752 |
| 2003/0186165 A1 | | 10/2003 | Gries et al. | 430/281.1 |
| 2004/0023136 A1 | * | 2/2004 | Munnelly et al. | 430/18 |
| 2004/0157153 A1 | * | 8/2004 | Takamuki | 430/270.1 |
| 2004/0179922 A1 | * | 9/2004 | Blake et al. | 414/411 |
| 2005/0266349 A1 | * | 12/2005 | Van Damme et al. | 430/300 |

* cited by examiner

*Primary Examiner*—Cynthia H Kelly
*Assistant Examiner*—Chanceity N Robinson

(57) ABSTRACT

A method of on-press developing a laser sensitive lithographic printing plate with ink and/or fountain solution is described. The printing member comprises on a substrate a photosensitive layer soluble or dispersible in ink and/or fountain solution and capable of hardening upon exposure to a laser. The plate is exposed with a laser and on-press developed with ink and/or fountain solution. The exposure and development are performed with the plate under lightings that contain no or substantially no radiation below a wavelength selected from 400 to 650 nm, or in the dark or substantially dark.

14 Claims, No Drawings

ON-PRESS DEVELOPMENT OF HIGH SPEED LASER SENSITIVE LITHOGRAPHIC PRINTING PLATES

RELATED PATENT APPLICATIONS

This application is a continuation application of U.S. patent application Ser. No. 11/057,663 filed Feb. 14, 2005 now U.S. Pat. No. 7,427,465.

FIELD OF THE INVENTION

This invention relates to lithographic printing plates. More particularly, it relates to on-press ink and/or fountain solution development of high-speed laser sensitive lithographic plates having on a substrate a photosensitive layer that has limited stability in ambient room light.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate. The exposed plate is usually developed with a liquid developer to bare the substrate in the non-hardened or solubilized areas.

On-press developable lithographic printing plates have been disclosed in the literature. Such plates can be directly mounted on press after exposure to develop with ink and/or fountain solution during the initial prints and then to print out regular printed sheets. No separate development process before mounting on press is needed. Among the patents describing on-press developable lithographic printing plates are U.S. Pat. Nos. 5,258,263, 5,516,620, 5,561,029, 5,616, 449, 5,677,110, 5,811,220, 6,014,929, 6,071,675, and 6,482, 571).

Phase-switchable lithographic printing plates have also been disclosed in the literature which comprise on a substrate a photosensitive layer, wherein the photosensitive layer has the same surface affinity as the substrate (to ink or fountain solution), and is capable of switching to the opposite affinity upon exposure with a radiation (with or without further treatment). The plate may be contacted with ink and fountain solution on press to form inked images in the exposed (or non-exposed) areas and clean background in the non-exposed (or exposed) areas.

In one embodiment of such phase-switchable plates, the imaged areas switch to opposite phase and also become hardened upon exposure to an actinic radiation. The non-exposed areas may be removed before or after mounting on press. For the latter, the non-exposed areas may be removed with ink and/or fountain solution during the initial or later stage of printing operation. Such plates are described in, for example, U.S. Pat. Nos. 6,331,375, 5,910,395, 6,740,464, and 6,136, 503.

Conventionally, the plate is exposed with an actinic light (usually an ultraviolet light from a lamp) through a separate photomask film having predetermined image pattern which is placed between the light source and the plate. While capable of providing plate with superior lithographic quality, such a method is cumbersome and labor intensive.

Laser sources have been increasingly used to imagewise expose a printing plate which is sensitized to a corresponding laser wavelength. This allows the elimination of the photomask film, reducing material, equipment and labor cost. Suitable lasers include infrared lasers (such as laser diode of about 830 nm and NdYAG laser of about 1064 nm), visible lasers (such as frequency-doubled NdYAG laser of about 532 nm, violet laser diode of about 390-430 nm), and ultraviolet laser (such as ultraviolet laser diode of about 350 to 370 nm). Among them, infrared laser diode, violet laser diode, and ultraviolet laser diode are most attractive. Infrared laser sensitive plates have the advantage of relative white or yellow light stability, violet laser sensitive plates have the advantage of low imager cost due to the low cost of the violet laser diode which is made in mass production for DVD, and ultraviolet laser diode sensitive plates have the advantage of higher sensitivity (requiring less laser dosage) than longer wavelength lasers.

Laser sensitive plates generally have higher sensitivity (than conventional film based plate) because of the limited laser power and the desire for fast imaging speed. Accordingly, photosensitive plates designed for laser imaging generally have limited room light stability. For example, before being developed to remove the non-hardened areas, frequency-doubled NdYAG laser sensitive plates usually require red room light for handling, violet laser sensitive plates usually require orange or yellow room light for handling, and infrared laser sensitive photopolymer plates usually require yellow room light for handling and have only limited white light stability (due to the use of certain initiator which has spectral sensitivity in the ultraviolet region).

Such limited room light stability is an inherent barrier for the design and use of on-press developable laser sensitive lithographic plate because the pressrooms are generally equipped with white lights, in addition to the difficulties in designing any on-press developable plate with good press performance (including film based on-press developable plate). Despite of such difficulties, there is a strong desire to develop a high speed laser sensitive on-press developable lithographic plate as well as methods of using it because of its environmental and economic benefits.

SUMMARY OF THE INVENTION

It is an object of this invention to provide a method of on-press developing a high speed laser sensitive lithographic printing plate comprising on a substrate a photosensitive layer which has limited stability at ambient room light.

It is another object of this invention to provide a method of on-press developing a laser sensitive lithographic printing plate comprising on a substrate a photosensitive layer which is on-press developable with ink and/or fountain solution.

It is yet another object of this invention to provide a method of on-press imaging and developing a photosensitive lithographic plate comprising on a substrate a photosensitive layer which is on-press developable with ink and/or fountain solution.

Further objects, features and advantages of the present invention will become apparent from the detailed description of the preferred embodiments.

According to die present invention, there has been provided a method of lithographically printing images on a receiving medium, comprising in order:

(a) providing a lithographic plate comprising (i) a substrate; and (ii) a photosensitive layer capable of hardening upon exposure to a laser, the non-hardened areas of said photosensitive layer being soluble or dispersible in ink (for waterless plate) or in ink and/or fountain solution (for wet plate), and the hardened areas of said photosensitive layer exhibiting an affinity or aversion substantially opposite to the affinity or aversion of said substrate to at least one printing liquid selected from the group consisting of ink, and an adhesive fluid for ink;

(b) imagewise exposing the plate with said laser to cause hardening of the photosensitive layer in the exposed areas;

(c) contacting said exposed plate with ink and/or fountain solution on a lithographic press to remove the photosensitive layer in the non-hardened areas; and (d) lithographically printing images from said plate to the receiving medium;

(e) wherein the steps (b) and (c) are performed with the plate under lightings that contain no or substantially no radiation below a wavelength selected from 400 to 650 nm, or in the dark or substantially dark.

Here the lightings (or darkness) for steps (b) and (c) can be different or the same. The lighting can be from any light source, including filtered fluorescence light, filtered incandescence light, filtered sunlight, yellow light from any source, any red light from any source, and mixture of lights from different sources.

In one embodiment of this invention the photosensitive layer exhibits an affinity or aversion substantially opposite to the affinity or aversion of said substrate to at least one printing liquid selected from the group consisting of ink and an adhesive fluid for ink. The photosensitive layer does not switch its affinity or aversion upon laser exposure.

In another embodiment of this invention, the photosensitive layer exhibits substantially the same affinity or aversion as said substrate and is capable of switching to opposite affinity or aversion to said substrate upon exposure to said laser (with or without further treatment).

The laser used in this invention can be any laser with a wavelength selected from 200 to 1200 nm (including ultraviolet, visible, and infrared lasers). The plate can be imagewise exposed with a laser on a plate exposure device and then transferred to a lithographic press for on-press development with ink and/or fountain solution by rotating the plate cylinder and engaging ink and/or fountain solution roller. The developed plate can then directly print images to the receiving sheets (such as paper). Alternatively the plate can be imagewise exposed with the laser on a lithographic press, on-press developed on the same press cylinder with ink and/or fountain solution, and then directly print images to the receiving sheets.

DETAILED DESCRIPTION OF THE PREFERRED EMBODIMENTS

The substrate employed in the lithographic plates of this invention can be any lithographic support. Such a substrate may be a metal sheet, a polymer film, or a coated paper. Aluminum (including aluminum alloy) sheet is a preferred metal support. Particularly preferred is an aluminum support that has been grained and anodized (with or without deposition of a barrier layer). Polyester film is a preferred polymeric film support. A surface coating may be coated to achieve desired surface properties. For wet plate, the substrate should have a hydrophilic or oleophilic surface, depending on the surface properties of the photosensitive layer; commonly, a wet lithographic plate has a hydrophilic substrate and an oleophilic photosensitive layer. For waterless plate, the substrate should have an oleophilic or oleophobic surface, depending on the surface properties of the photosensitive layer.

Particularly suitable hydrophilic substrate for a wet lithographic plate is an aluminum support that has been grained and anodized; such a substrate is preferably further deposited with a hydrophilic barrier layer. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid. copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153,461, 4,399,021, and 5,368,974. Suitable polymer film supports for a wet lithographic plate include a polymer film coated with a hydrophilic layer, preferably a hydrophilic layer that is crosslinked, as described in U.S. Pat. No. 5,922,502.

For preparing lithographic printing plates of the current invention, any photosensitive layer is suitable which is capable of hardening upon exposure to a laser having a wavelength selected from 200 to 1200 nm, and is soluble or dispersible in ink (for waterless plate) or in ink and/or fountain solution (for wet plate). Here hardening means becoming insoluble and non-dispersible in ink and/or fountain solution. Hardening is generally achieved through crosslinking or polymerization of the resins (polymers or monomers). A laser sensitive dye or pigment is usually used in the photosensitive layer. The photosensitive layer preferably has a coverage of from 100 to 4000 mg/m$^2$, and more preferably from 400 to 2000 mg/m$^2$.

Photosensitive layer suitable for the current invention may be formulated from various photosensitive materials, usually with addition of a sensitizing dye or pigment. The composition ratios (such as monomer to polymer ratio) are usually different from conventional plates designed for development with a regular liquid developer. Various additives may be added to, for example allow or enhance on-press developability. Such additives include surfactant, plasticizer, water soluble polymer or small molecule, and ink soluble polymer or small molecule. The addition of nonionic surfactant is especially helpful in making the photosensitive layer dispersible with ink and fountain solution, or emulsion of ink and fountain solution. Various additives useful for conventional photosensitive layer can also be used. These additives include pigment, dye, exposure indicator, and stabilizer.

In this patent, the term monomer includes both monomer and oligomer, and the term (meth)acrylate includes acrylate and/or methacrylate (acrylate, methacrylate, or both acrylate and methacrylate). In calculating the weight ratio of the monomer to the polymeric binder, the weight of the monomer includes the total weight of all monomers and the weight of the polymeric binder includes the total weight of all polymeric binders. The term yellow or red light means yellow light, red light or any light with a color between yellow and red such as orange light.

Photosensitive materials useful in wet plates of this invention include, for example, photosensitive compositions comprising a polymerizable monomer, an initiator, a sensitizing dye, and optionally a polymer.

Photosensitive oleophobic materials useful in waterless plates of this invention include, for example, compositions comprising a monomer having perfluoroalkyl or polysiloxane groups and crosslinkable terminal groups, an initiator, and a sensitizing dye.

Infrared laser sensitive materials useful for wet lithographic plates of this invention include, for example, thermosensitive compositions comprising a polymerizable monomer, an initiator, an infrared light absorbing dye and optionally a polymer.

Visible or ultraviolet light sensitive materials useful for wet plates of this invention include, for example, photosensitive compositions comprising a polymerizable monomer, an initiator, a visible or ultraviolet light sensitizing dye, and optionally a polymer.

Polymeric binder for the photosensitive layer of this invention can be any film-forming polymer. The polymers may or may not have (meth)acrylate groups or other polymerizable double bonds such as allyl groups. Examples of suitable polymers include (meth)acrylic polymers and copolymers (such as polybutylmethacrylate, polyethylmethacrylate, polymethylmethacrylate, polymethylacrylate, butylmethacrylate/methylmethacrylate copolymer, and methylmethacrylate/methylmethacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, and polyurethane binder.

Suitable free-radical polymerizable monomers (including oligomers) include, for example, multifunctional acrylate monomers or oligomers, such as (meth)acrylate esters of ethylene glycol, trimethylolpropane pentaerythritol, ethoxylated ethylene glycol and ethoxylated trimethylolpropane, multifunctional urethanated (meth)acrylate, and epoxylated (meth)acrylate; and oligomeric amine diacrylates. Urethanated (meth)acrylate with at least six (meth)acrylate groups and non-urethanated (meth)acrylate with at least four (meth)acrylate groups are preferred monomers because of their fast curing speed. Combinations of urethanated (meth)acrylate and non-urethanated (meth)acrylate are especially useful. Various monomer combinations are described in U.S. patent application Ser. No. 10/720,882, the entire disclosure of which is hereby incorporated by reference, and can be used for the preparation of the photosensitive layer of this invention.

Suitable free-radical initiators include, for example, the derivatives of acetophenone (such as 2,2-dimethoxy-2-phenylacetophenone, and 2-methyl-1-[4-(methylthio)phenyl]-2-morpholino propan-1-one), onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate, bis(4-t-butylphenyl)iodonium hexafluorophosphate, triarylsulfonium hexafluorophosphate, triarylsulfonium p-toluenesulfonate, (3-phenylpropan-2-onyl)triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; titanocene such as bis($\eta^9$-2,4-cyclopentadien-1-yl)bis[2,6-difluoro-3-(1H-pyrrol-1-yl)phenyl)titanium; hexaaryrlbiimidazole compounds such as 2,2'-bis(2-chlorophenyl)-4,4',5,5'-tetraphenyl-1,1'-bimidazole, 2,2'-bis(2-ethoxyphenyl)-4,4',5,5'-tetraphenyl-1,1'-biimidazole, 2-(1-naphthyl)-4,5-diphenyl-1,2'-biimidazole: and derivatives of acetophenone such as 2,2-dimethoxy-2-phenylacetophenone, and 2-methyl-1-[4-(methylthio)phenyl]-2-morpholino propan-1-one. Triarylsulfonium salts, diaryliodonium salts, and triarylalkylborate salts are particularly suitable for infrared laser sensitive plate. Titanocene compounds and hexaarylbiimidazole compounds are particularly suitable for visible or ultraviolet laser sensitive plate. The initiator is added in the photosensitive layer preferably at 0.1 to 40% by weight of the photosensitive layer, more preferably 1 to 30%. and most preferably 5 to 20%.

Suitable polyfunctional epoxy monomers include, for example, 3,4-epoxycyclohexylmethyl-3,4-epoxycyclohexane carboxylate, bis-(3,4-epoxycyclohexymethyl)adipate, difunctional bisphenol A/epichlorohydrin epoxy resin and multifunctional epichlorohydrin/tetraphenylol ethane epoxy resin.

Suitable cationic photoinitiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Bronsted acid, they also generate free radicals during photo or thermal decomposition.

Infrared sensitizing dyes useful in the infrared sensitive photosensitive layer (also called thermosensitive layer) of this invention include any infrared absorbing dye effectively absorbing an infrared radiation having a wavelength of 750 to 1200 nm. It is preferable that the dye has an absorption maximum between the wavelengths of 800 and 1100 nm. Various infrared absorbing dyes are described in U.S. Pat. Nos. 5,853,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine). phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes.

Visible or ultraviolet sensitizing dyes useful in the visible or ultraviolet sensitive photosensitive layer of this invention include any dyes having a wavelength maximum of from 200 to 600 nm and capable of directly or indirectly causing polymerization of the monomers upon exposure to the corresponding laser. Usually, the visible or ultraviolet dye activates an initiator to cause the polymerization of the monomer upon exposure to a laser. Suitable visible and ultraviolet sensitive dyes include, for example, cyanine dyes (including polymethine dyes); rhodamine compounds such as rhodamine 6G perchloride; chromanone compounds such as 4-diethylaminobenzilidene chromanone; dialkylaminobenzene compounds such as ethyl 4-dimethylaminobenzoate and dialkylaminobenzene; dialkylaminobenzophenone compounds such as 4,4'-bis(dimethylamino)benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminophenyl)1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl)1,3,4-thiadiazole, (p-dimethylaminophenyl)pyridine, (p-diethylaminophenyl)pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds and bis(dialkylamino)benzophenone compounds are particularly suitable for ultraviolet laser sensitive plate. Bis(dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention.

The photosensitive composition of the present invention preferably contains a hydrogen-donor compound as a polymerization accelerator. Examples of the hydrogen-donor compound include compounds having a mercapto group such as 2-mercaptobenzothiazole, 2-mercaptobenzimidazole, 2-mercaptobenzoxazole and 3-mercapto-1,2,4-triazole, N,N-dialkyl benzoic alkyl ester, N-aryl-α-amino acids, their salts and esters such as N-phenylglycine salts of N-phenylglycine, and alkyl esters of N-phenylglycine such as N-phenylglycine ethyl ester and N-phenylglycine benzyl ester.

Various surfactants may be added into the photosensitive layer to allow or enhance the on-press developability with ink and/or fountain. Both polymeric and small molecule surfactants can be used. However, it is preferred that the surfactant has low or no volatility so that it will not evaporate from the photosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g photosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers: and polyethoxylated alkylphenols and polyethoxylated fatty alcohols. The nonionic surfactant is preferably added at from 0.1 to 30% by weight of the photosensitive layer, more preferably from 0.5 to 20%, and most preferably from 1 to 15%.

For plates with rough and/or porous surface capable of mechanical interlocking with a coating deposited thereon, a thin water soluble interlayer may be deposited between the substrate and the photosensitive layer. Here the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However one or more surfactant and other additives may be added. The water-soluble polymer is generally coated from an aqueous solution with water as the only solvent. A water-soluble organic solvent, preferably an alcohol such as ethanol or isopropanol can be added into the water-soluble polymer aqueous coating solution to improve the coatability. The water-soluble organic solvent is preferably added at less than 20% by weight of the solution, more preferably at less than 10%. The releasable interlayer preferably has an average coverage of 1 to 200 mg/m$^2$, more preferably 2 to 100 mg/m$^2$, and most preferably 4 to 40 mg/m$^2$. The substrate preferably has an average surface roughness Ra of 0.2 to 2.0 microns, and more preferably 0.4 to 1.0 microns.

The photosensitive layer may be conformally coated onto a roughened substrate (for example, with Ra of larger than 0.4 microns) at thin coverage (for example, of less than 1.2 g/m$^2$) so that the plate can have microscopic peaks and valleys on the photosensitive layer coated surface and exhibit low tackiness and good block resistance, as described in U.S. Pat. No. 6,242,156, the entire disclosure of which is hereby incorporated by reference.

A water soluble or dispersible overcoat can be coated on the photosensitive layer to, for example, improve the photospeed, surface durability, and/or on-press developability of the plate. The overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) may also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic emulsion or dispersion may be added into the overcoat to, for example, reduce the tackiness or moisture sensitivity of the plate. The overcoat preferably has a coverage of from 0.001 to 3.0 g/m$^2$, more preferably from 0.005 to 1.0 g/m$^2$, and most preferably from 0.01 to 0.15 g/m$^2$.

In a preferred embodiment for the thermosensitive lithographic printing plates of this invention, the thermosensitive layer comprises at least one polymeric binder (with or without ethylenic functionality), at least one polymerizable ethylenically unsaturated monomer having at least one terminal ethylenic group, at least one free-radical initiator capable of generating free radical at elevated temperature and/or through charge transfer from a radiation-activated infrared dye, and at least one infrared absorbing dye or pigment. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. The monomer-to-polymer weight ratio is preferably larger than 1, more preferably larger than 1.5, and most preferably larger than 2.0.

In another preferred embodiment for the thermosensitive lithographic printing plates of this invention, the thermosensitive layer comprises a polymeric binder, a urethane (meth) acrylate monomer having at least 6 (meth)acrylate groups, a non-urethane (meth)acrylate monomer having at least 4 (meth)acrylate groups, a free-radical initiator, and an infrared absorbing dye. The weight ratio of the urethane (meth)acrylate monomer to the non-urethane (meth)acrylate monomer is preferably from 0.10 to 3.0, more preferably from 0.15 to 2.0, even more preferably from 0.20 to 1.5, and most preferably from 0.30 to 1.0.

In a preferred embodiment for visible or ultraviolet light sensitive lithographic printing plates of this invention, the photosensitive layer comprises at least one polymeric binder (with or without ethylenic functionality), at least one polymerizable ethylenically unsaturated monomer having at least one terminal ethylenic group, at least one free-radical initiator, and at least one visible or ultraviolet sensitizing dye. Other additives such as surfactant, dye or pigment, exposure-indicating dye, and free-radical stabilizer may be added. The monomer-to-polymer weight ratio is preferably larger than 1, more preferably larger than 1.5, and most preferably larger than 2.0.

In another preferred embodiment for visible or ultraviolet light sensitive lithographic printing plates of this invention, the photosensitive layer comprises a polymeric binder, a urethane (meth)acrylate monomer having at least 6 (meth)acrylate groups, a non-urethane (meth)acrylate monomer having at least 4 (meth)acrylate groups, a free-radical initiator, and a visible or ultraviolet sensitizing dye. The weight ratio of the urethane (meth)acrylate monomer to the non-urethane (meth) acrylate monomer is preferably from 0.10 to 3.0. more preferably from 0.15 to 2.0, even more preferably from 0.20 to 1.5, and most preferably from 0.30 to 1.0.

On-press developable lithographic plates as described in U.S. Pat. Nos. 6,482,571, 6,576,401, 5,548,222, and 6,541,183, the entire disclosures of which are hereby incorporated by reference, can be used for the instant invention.

A hydrophilic or oleophilic micro particles may be added into the photosensitive layer to enhance, for example, the developability and non-tackiness of the plate. Suitable micro particles include polymer particles, talc, titanium dioxide, barium sulfate, silicone oxide, and aluminum micro particles, with an average particle size of less than 10 microns, preferably less than 5 microns, more preferably less than 2 microns, and most preferably less than 1 microns. A suitable particular dispersion is described in U.S. Pat. No. 6,071,675, the entire disclosure of which is hereby incorporated by reference.

The hardened areas of the photosensitive layer should exhibit an affinity or aversion substantially opposite to the affinity or aversion of the substrate to at least one printing liquid selected from the group consisting of ink and an adhesive fluid for ink. For example, a wet plate can have a hydrophilic substrate and an oleophilic photosensitive layer, or can have an oleophilic substrate and a hydrophilic photosensitive layer; a waterless plate can have an oleophilic substrate and an oleophobic photosensitive layer, or can have an oleophobic substrate and an oleophilic photosensitive layer. An adhesive fluid for ink is a fluid that repels ink. Fountain solution is the most commonly used adhesive fluid for ink. A wet plate is printed on a wet press equipped with both ink and fountain solution, while a waterless plate is printed on a waterless press equipped with ink.

Usually, as for most printing plates described in the literature, the photosensitive layer exhibits an affinity or aversion substantially opposite to the affinity or aversion of the substrate to at least one printing liquid selected from the group consisting of ink and an adhesive fluid for ink, and does not switch its affinity or aversion upon laser exposure. However, certain photosensitive layer exhibits substantially the same affinity or aversion as the substrate and is capable of switching to opposite affinity or aversion upon exposure to a laser (with or without further treatment), as described in U.S. Pat. Nos. 6,331,375, 5,910,395, 6,720,464, and 6,136,503. Both non-phase-switchable photosensitive layer and phase-switchable photosensitive layer can be used for the current invention. Non-phase-switchable photosensitive layer is preferred.

Infrared lasers useful for the imagewise exposure of the thermosensitive plates of this invention include laser sources emitting in the near infrared region, i.e. emitting in the wavelength range of from 750 to 1200 nm, and preferably from 800 to 1100 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably from 1 to 400 $mJ/cm^2$, more preferably from 5 to 200 $mJ/cm^2$, and most preferably from 20 to 100 $mJ/cm^2$, depending on the sensitivity of the thermosensitive layer.

Visible lasers useful for the imagewise exposure of the visible light sensitive plates of this invention include any laser emitting in the wavelength range of from 390 to 600 nm. Examples of suitable visible lasers include frequency-doubled Nd/YAG laser (about 532 nm), argon ion laser (about 488 nm), violet diode laser (about 410 nm), and visible LEDs. Violet laser diode is especially useful because of its small size and relatively lower cost. The exposure dosage is preferably from 0.0001 to 5 $mJ/cm^2$ (0.1 to 5000 $\mu J/cm^2$), more preferably from 0.001 to 0.5 $mJ/cm^2$ (1 to about 500 $\mu J/cm^2$), and most preferably from 0.005 to 0.10 $mJ/cm^2$ (5 to 100 $\mu J/cm^2$), depending on the sensitivity of the photosensitive layer.

Ultraviolet lasers useful for the imagewise exposure of the ultraviolet light sensitive plates of this invention include any laser having a wavelength of from 200 to 390 nm. Examples of ultraviolet lasers include ultraviolet diode lasers or LEDs having a wavelength of from 350 to 390 nm. Laser diodes are preferred ultraviolet lasers. The exposure dosage is preferably from 0.0001 to 5 $mJ/cm^2$ (0.1 to 5000 $\mu J/cm^2$), more preferably from 0.001 to 0.5 $mJ/cm^2$ (1 to about 500 $\mu J/cm^2$), and most preferably from 0.005 to 0.10 $mJ/cm^2$ (5 to 100 $\mu J/cm^2$), depending on the sensitivity of the photosensitive layer.

Laser imaging devices are currently widely available commercially. Any device can be used which provides imagewise laser exposure according to digital imaging information. Commonly used imaging devices include flatbed imager, internal drum imager, and external drum imager, all of which can be used for the imagewise laser exposure in this invention.

The on-press developable plate is usually exposed on an exposure device, and then mounted on press to develop with ink and/or fountain solution and then print out regular printed sheets. However, the plate can also be exposed on a printing press (such as by mounting on the plate cylinder or sliding through a flatbed imager mounted on the press), and the exposed plate can be directly developed on press with ink and/or fountain solution and then print out regular printed sheets. The ink and/or fountain solution solubilized or dispersed photosensitive layer and/or overcoat can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium (such as paper). Good quality prints should be obtained preferably under 40 initial impressions, more preferably under 20 impressions, and most preferably under 5 impressions.

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation. The recently introduced single fluid ink that can be used for printing wet lithographic plate without the use of fountain solution, as described in for example U.S. Pat. No. 6,140,392, can also be used for the on-press development and printing of the plate of this invention.

The plate may be rinsed or applied with an aqueous solution, including water and fountain solution, to remove the water soluble or dispersible overcoat (for plate with an overcoat) and/or to dampen without developing the plate, after imagewise exposure and before on-press development with ink and/or fountain solution.

For lithographic plates having a free radical crosslinkable photosensitive layer, a liquid layer may be applied onto the surface of the plate (with or without an overcoat) before and/or during imaging process to provide an in situ oxygen barrier layer during the imaging process to allow faster photospeed and better curing. The liquid layer can be any liquid material that is compatible with the plate. Water, fountain solution, and other aqueous solutions are preferred materials for forming the liquid layer. The liquid layer may be applied from a dampening roller of a lithographic press with the plate being mounted on the plate cylinder during on-press imaging process. The dampening roller can be a regular dampening roller which supplies fountain solution during printing or can be a different roller.

For plates having a free radical polymerizable photosensitive layer, an inert gas (such as nitrogen) may be introduced within the device or near the exposure areas during a laser imaging process to reduce inhibition of free radical polymerization of the photosensitive layer by oxygen. The inert gas may be flushed from a nozzle mounted next to the laser head onto the areas being imaged during the laser imaging process; this is especially useful for external drum imaging devices, including off-press laser imaging devices having an external drum and on-press laser imaging devices utilizing plate cylinder as the imaging drum.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing: Science and Technology" by Pappas, Plenum Press, New York, 1992.

The fountain solution used in this application can be any fountain solution used in lithographic printing. Fountain solution is used in the wet lithographic printing press to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of the plate substrate as well as the plate. Various fountain solution compositions are described in U.S. Pat. Nos. 4,030,417 and 4,764,213.

Emulsion of ink and fountain solution is an emulsion formed from ink and fountain solution during wet lithographic printing process. Because fountain solution (containing primarily water) and ink are not miscible, they do not form stable emulsion. However, emulsion of ink and fountain solution can form during shearing, compressing, and decompressing actions by the rollers and cylinders, especially the ink rollers and plate cylinder, on a wet lithographic press. For wet press with integrated inking system ink and fountain solution arc emulsified on the ink rollers before transferred to the plate.

The laser exposure and the on-press development are independently performed with the plate under a lighting that contains no or substantially no radiation below a wavelength selected from 400 to 650 nm, or in the dark or substantially dark; preferably under a lighting that contains no radiation below a wavelength selected from 400 to 650 nm, or in the dark. Such lighting is usually a yellow or red light. This includes a light that is from a fluorescence or incandescence lamp that is covered with a filter that cuts off all or substantially all (at least 99%) of the radiation below a wavelength selected from 400 to 650 nm; preferably the lamp is covered with a filter that cuts off all of the radiation below a wavelength selected from 400 to 650 nm. The laser exposure and the on-press development can be performed with the plate under the same or different lightings.

The term "substantially no radiation below a wavelength" means the intensity of the radiation below that wavelength is less than 1% of that for a regular 100-watt incandescence light (for home use, not focused) at a distance of 2 meters. The term "substantially dark" means the intensity of the radiation is less than 1% of that for a 100-watt incandescence light at a distance of 2 meters. For the purpose of this application, both the office fluorescence light and incandescence light are considered as white light.

The lighting that contains no or substantially no radiation below a wavelength selected from 400 to 650 nm (usually as a yellow or red light) allows a working lighting condition for the operators. Alternatively, the plate can be handled automatically in the dark, including in a dark room or in a light-tight box of any shape. Preferably, during the handling before exposure and the handling before mounting on press, the plate is in a lighting or lightings that contain no or substantially no radiation below a wavelength selected from 400 to 650 nm, or in the dark or substantially dark.

In one embodiment of the instant invention, both the laser exposure and on-press development are performed under a lighting that contains no or substantially no radiation below a wavelength selected from 400 to 650 nm; the lightings for the laser exposure and on-press development can be the same or different. In the second embodiment, the laser exposure is performed under a lighting that contains no or substantially no radiation below a wavelength selected from 400 to 650 nm and the on-press development is performed in the dark or substantially dark. In the third embodiment, the laser exposure is performed in the dark or substantially dark and the on-press development is performed under a lighting that contains no or substantially no radiation below a wavelength selected from 400 to 650 nm. In the fourth embodiment, both the laser exposure and the on-press development are performed in the dark or substantially dark.

The plates can be packaged in a light-tight (or yellow or red light passing only) cassette. The cassette can be connected to the laser exposure device with light-tight (or yellow or red light passing only) covers for the plate being exposed. The plate can be automatically transferred to the exposure device for laser exposure. The exposed plate can be transferred to the press for on-press development manually under yellow or red light, or automatically under yellow or red light or in the dark.

The plate on the press can be open to the room lighting which is a yellow or red light or in the dark or substantially dark. Preferably, the press is designed in a way so that the plate is fully covered with a cover (or covers) which allows only yellow or red light passing through (allowing viewing) or no light passing through; this allows white lighting for the pressroom.

For on-press exposure and development, the plate can be exposed on press before mounting on the plate cylinder (such as exposed with a flatbed laser scanner installed on the press), or can be exposed on the plate cylinder. The plate on the press can be open to the room lighting which is a yellow or red light or in the dark or substantially dark. Preferably, the press is designed in a way so that the plate is fully covered with a cover (or covers) that cuts off all of the radiation below a wavelength selected from 400 to 650 nm, during exposure and/or on-press development. The plate can be loaded manually under a yellow or red room lighting. Preferably, the plate is automatically loaded onto the press for on-press exposure and development from a light-tight cassette, under white room lighting.

The lighting used in this invention can be any light that contains no or substantially no radiation below a wavelength selected from 400 to 650 nm. Such a cut off wavelength can be 400, 450, 500, 550, 600, and 650 nm, or any wavelength between 400 and 650 nm, depending on the spectral sensitivity of the plate. Usually, such light is achieved by adding a filtering cover or coating to a white fluorescence or incandescence lamp to cut off the radiation at shorter wavelength. Such light includes yellow and red lights (including any light with color between yellow and red, such as orange light). Various yellow and red lights are commercially available (such as from EncapSulite International Inc. and General Electric), and can be used for the instant invention.

This invention is further illustrated by the following examples of its practice. Unless specified, all the values are by weight.

EXAMPLES 1-5

An electrochemically roughened, anodized, and polyvinylphosphonic acid treated aluminum sheet was first coated with a 0.1% aqueous solution of polyvinyl alcohol (Celvol 540, from Celanese) with a #6 Meyer rod, followed by drying in an oven at 100° C. for 2 min. The polyvinyl alcohol coated substrate was further coated with the photosensitive layer formulation PS-1 with a #8 Meyer rod, followed by drying in an oven at 90° C. for 2 min.

| PS-1 | |
|---|---|
| Component | Weight ratios |
| Neocryl B-728 (Polymer from Zeneca) | 3.193 |
| Sartomer SR-399 (Acrylic monomer from Sartomer) | 7.630 |
| Pluronic L43 (Nonionic surfactant from BASF) | 0.649 |
| 2,2-Bis(2-chlorophenyl)-4,4',5,5'-tetraphenyl-1,1'-biimidazole | 1.407 |
| 2-Mercaptobenzoxazole | 0.839 |
| 4,4'-Bis(diethylamino)benzophenone | 0.281 |
| 2-Butanone | 86.000 |

The photosensitive layer coated plate was further coated with a water-soluble overcoat OC-1 using a #6 Meyer rod, followed by drying in an oven at 100° C. for 2 min.

| OC-1 | |
|---|---|
| Component | Weight ratios |
| Airvol 205 (polyvinyl alcohol from Air Products) | 0.40 |
| Dioctyl sulfosuccinate sodium salt (surfactant) | 0.02 |
| Water | 99.58 |

The plate was exposed with a violet plate imager equipped with a 30 mw violet laser diode emitting at about 405 nm (MAKO-4 from ECRM) for a dosage of about 60µJ/cm$^2$. The plate was imaged in a dim red light room, and was kept in a light tight box before and after imaging.

The laser exposed plate was cut into five pieces, and each piece was wrapped with a separate aluminum foil. Each piece of the plate was tested on press under a different lighting condition. The first piece was tested in the dark (with all lights turned off). The second piece was tested under a 60-watt yellow light (yellow coated incandescence light. from General Electric). The third piece was tested under a 60-watt red light (red coated incandescence light, from General Electric). The fourth piece was tested under a 20-watt white office fluorescence light (from General Electric). The fifth piece was tested under a 100-watt regular incandescence light (for home use, from General Electric). Each light was about 2 meters from the top of the press. It took about 5 minutes to mount each plate and start up the press.

Each of the exposed plate pieces was unwrapped and tested on a wet lithographic press (AB Dick 360) under the above described lighting condition (including dark). The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper. The printed sheets were evaluated for the on-press developability of the plates, with the results summarized in Table 1.

TABLE 1

| Press room lighting | Background at 20 impressions | Background at 200 impressions | Inking in imaging areas |
| --- | --- | --- | --- |
| In the dark (no light) | Clean | Clean | Good |
| Yellow light | Clean | Clean | Good |
| Red light | Clean | Clean | Good |
| White fluorescence light | Inked | Heavy toning | Good |
| Regular incandescence light | Inked | Heavy toning | Good |

EXAMPLES 6-10

An electrochemically roughened, anodized, and silicate treated aluminum sheet was coated with thermosensitive layer formulation PS-2 using a #8 Meyer rod, followed by drying in an oven at 90° C. for 2 min.

PS-2

| Component | Weight ratios |
| --- | --- |
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| 2,4-Bis(trichloromethyl)-6-[(4-ethoxyethylenoxy)-phen-1-yl]-s-triazine | 1.00 |
| ADS-830AT (Infrared absorbing cyanine dye from American Dye Source) | 0.10 |
| Acetone | 90.0 |

The thermosensitive layer coated plate was further coated with a water-soluble overcoat OC-2 using a #6 Meyer rod, followed by drying in an oven at 100° C. for 2 min.

OC-2

| Component | Weight ratios |
| --- | --- |
| Airvol 205 (Polyvinyl alcohol from Air Products) | 5.00 |
| Zonyl FSO (Perfluorinated surfactant from DuPont) | 0.02 |
| Water | 95.00 |

The plate was exposed with an infrared laser plate imager equipped with laser diodes emitting at about 830 nm (Trendsetter from Creo) at a dosage of 150 mJ/cm². The plate was imaged in a dim red light room, and was kept in a light tight box before and after imaging.

The laser exposed plate was cut into five pieces, and kept in a light-tight box for all the time except for the specific exposure as indicated. The first piece was kept in the dark (in a box) all the time after exposure. The second piece was exposed to a 60-watt yellow light (yellow coated incandescence light, from General Electric) at a distance of 2 meters for 60 minutes. The third piece was exposed to a 60-watt red light (red coated incandescence light, from General Electric) at a distance of 2 meters for 60 minutes. The fourth piece was exposed to a 40-watt white office fluorescence light (from General Electric) at a distance of 2 meters for 60 minutes. The fifth piece was exposed to a 100-watt regular incandescence light (for home use, from General Electric) at a distance of 2 meters for 60 minutes.

The exposed plate pieces as treated above were tested on a wet lithographic press (AB Dick 360) under a dim red light. The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper. The printed sheets were evaluated for the on-press developability of the plates, with the results summarized in Table 2.

TABLE 2

| Room light exposure before mounting on press | Background at 20 impressions | Background at 200 impressions | Inking in imaging areas |
| --- | --- | --- | --- |
| In the dark (no exposure) | Clean | Clean | Good |
| Yellow light for 60 minutes | Clean | Clean | Good |
| Red light for 60 minutes | Clean | Clean | Good |
| White office fluorescence light for 60 mintues | Inked | Heavy toning | Good |
| Regular incandescence light for 60 minutes | Inked | Heavy toning | Good |

I claim:

1. A method of lithographically printing images on a receiving medium, comprising in order:
   (a) providing a lithographic plate comprising (i) a substrate, and (ii) a photosensitive layer capable of hardening upon exposure to a laser having a wavelength selected from 200 to 1200 nm; said photosensitive layer being soluble or dispersible in ink and/or fountain solution, and exhibiting an affinity or aversion opposite to the affinity or aversion of said substrate to at least one printing liquid selected from the group consisting of ink and an abhesive fluid for ink;
   (b) imagewise exposing said plate with said laser to cause hardening of the photosensitive layer in the exposed areas;
   (c) developing said exposed plate with ink and/or fountain solution to remove the photosensitive layer in the non-hardened areas; and
   (d) lithographically printing images from said plate to the receiving medium;
   (e) wherein said plate is mounted on the plate cylinder of a lithographic press for said exposure and development (steps b and c); and said press is in a pressroom with white room light and is shielded with covers that are non-transparent or only transparent to yellow or red light so that said plate is under a lighting that contains no radiation below a wavelength selected from 400 to 650 nm or in darkness during said exposure and development (steps b and c).

2. The method of claim 1 wherein said plate is automatically transferred from a light-tight cassette onto said press for said on-press exposure and development.

3. The method of claim 1 wherein said laser is an ultraviolet laser having a wavelength of about 350 to 390 nm, said plate is imagewise exposed with said laser at a dosage of less than 100 µJ/cm², and said lightings in said steps (b) and (c) contain no radiation below a wavelength selected from 400 to 550 mm 4. The method of claim 1 wherein said laser is a violet laser having a wavelength of about 390 to 430 nm, said plate is imagewise exposed with said laser at a dosage of less than 200

μJ/cm², and said lightings in said steps (b) and (c) contain no radiation below a wavelength selected from 450 to 600 nm.

5. The method of claim 1 wherein said laser is an infrared laser having a wavelength of about 800 to 1100 nm, said photosensitive layer is capable of hardening upon exposure with said infrared laser as well as with an ultraviolet radiation, and said lightings in said steps (b) and (c) contain no radiation below a wavelength selected from 400 to 550 nm.

6. The method of claim 1 wherein said plate further comprises a water soluble or dispersible overcoat.

7. The method of claim 1 wherein said photosensitive layer comprises a free radical polymerizable ethylenically unsaturated monomer, a free radical initiator, and a sensitizing dye.

8. The method of claim 1 wherein said photosensitive layer comprises a free radical polymerizable ethylenically unsaturated monomer, a free radical initiator, and an infrared absorbing dye or pigment; and the monomer-to-polymer weight ratio is larger than 2.0.

9. The method of claim 1 wherein said substrate is hydrophilic and said photosensitive layer is oleophilic.

10. A method of lithographically printing images on a receiving medium, comprising in order:
    (a) providing a lithographic plate comprising (i) a substrate, and (ii) a photosensitive layer capable of hardening upon exposure to a laser having a wavelength selected from 200 to 1200 nm; said photosensitive layer being soluble or dispersible in ink and/or fountain solution, and exhibiting the same affinity or aversion as said substrate and being capable of switching to opposite affinity or aversion to said substrate upon exposure to said laser;
    (b) imagewise exposing said plate with said laser to switch the affinity or aversion of the photosensitive layer and cause hardening of the photosensitive layer in the exposed areas;
    (c) developing said exposed plate with ink and/or fountain solution to remove the photosensitive layer in the non-hardened areas; and
    (d) lithographically printing images from said plate to the receiving medium;
    (e) wherein said plate is mounted on the plate cylinder of a lithographic press for said exposure and development (steps b and c); and said press is in a pressroom with white room light and is shielded with covers that are non-transparent or only transparent to yellow or red light so that said plate is under a lighting that contains no radiation below a wavelength selected from 400 to 650 nm or in darkness during said exposure and development (steps b and c).

11. The method of claim 10 wherein said plate is automatically transferred from a light-tight cassette onto said press for said on-press exposure and development.

12. The method of claim 10 wherein said laser is an ultraviolet laser having a wavelength of about 350 to 390 nm, said plate is imagewise exposed with said laser at a dosage of less than 100 μJ/cm², and said lightings in said steps (b) and (c) contain no radiation below a wavelength selected from 400 to 550 nm.

13. The method of claim 10 wherein said laser is a violet laser having a wavelength of about 390 to 430 nm, said plate is imagewise exposed with said laser at a dosage of less than 200 μJ/cm², and said lightings in said steps (b) and (c) contain no radiation below a wavelength selected from 450 to 600 nm.

14. The method of claim 10 wherein said laser is an infrared laser having a wavelength of about 800 to 1100 nm, said photosensitive layer is capable of hardening upon exposure with said infrared laser as well as with an ultraviolet radiations and said lightings in said steps (b) and (c) contain no radiation below a wavelength selected from 400 to 550 nm.

* * * * *